United States Patent [19]

Lu

[11] Patent Number: 5,688,710

[45] Date of Patent: Nov. 18, 1997

[54] METHOD OF FABRICATING A TWIN-WELL CMOS DEVICE

[75] Inventor: Bing-Yau Lu, Taipei, Taiwan

[73] Assignee: Holtek Microelectronics, Inc., Hsinchu, Taiwan

[21] Appl. No.: 757,179

[22] Filed: Nov. 27, 1996

[51] Int. Cl.$^6$ ............................................. H01L 27/00
[52] U.S. Cl. ................................ 437/57; 437/34; 437/70; 437/924; 148/DIG. 70
[58] Field of Search ............................. 437/34, 56, 57, 437/58, 924, 70; 148/DIG. 70

[56] References Cited

U.S. PATENT DOCUMENTS

| | | | |
|---|---|---|---|
| 5,002,902 | 3/1991 | Watanabe | 437/235 |
| 5,091,332 | 2/1992 | Bohr et al. | 437/69 |
| 5,252,510 | 10/1993 | Lee et al. | 437/57 |
| 5,300,797 | 4/1994 | Bryant et al. | 257/206 |

Primary Examiner—John Niebling
Assistant Examiner—Long Pham
Attorney, Agent, or Firm—W. Wayne Liauh

[57] ABSTRACT

A method of fabricating a twin-well integrated circuit device to implant the dopants directly through the nitride layer including steps of: The pad oxide layer and nitride layer are formed on a P-type semiconductor silicon wafer. Then, the alignment mark photoresist pattern is formed by the conventional lithography technique, where the alignment mark region is in clear field, while other regions are in dark field. Next, the nitride layer is patterned by plasma-etching technique to form the nitride alignment mark. The N-well region is formed by lithography and ion-implantation techniques. Thereafter, the P-well region is formed by lithography and ion-implantation methods again. Next, the active device region photoresist is formed by lithography technique. The nitride layer is partially etched to open the windows by plasma-etching technique. The P-well region photoresist is then formed, followed by the deep-implantation process. The second P-well region photoresist is then formed, followed by the deep-implantation process. The field oxide regions for isolation are also grown in the window openings during the P-field drive-in step. Finally, the remaining of nitride layer is removed. This new process can reduce the number of processing steps so as to decrease the production cost.

9 Claims, 5 Drawing Sheets

METHOD OF FABRICATING A TWIN-WELL CMOS DEVICE

BACKGROUND OF THE INVENTION

1. Field of the Invention

The present invention relates to the fabrication of a twin-well complementary Metal-Oxide-Semiconductor (CMOS) field effect transistor device, and more particularly to a fabrication method which has less processing steps.

2. Description of the Prior Art

The conventional method of fabricating a twin-well in a CMOS integrated circuit device is first forming a pad oxide layer in a semiconductor silicon substrate. Then the N-doped and P-doped regions which are overlaying the pad oxide layer are formed. The dopants are ion implanted through the pad oxide layer into the semiconductor silicon substrate. (See U.S. Pat. No. 4,707,455 to Tsang et al., the entire disclosure of which is herein incorporated reference, and also U.S. Pat. No. 5,460,984 to Yoshida, the entire disclosure of which is herein incorporated reference.) Next, the impurities in well regions are thermally driven in a high-temperature environment to form the desired well depths, and grow the field oxide layer for isolation spontaneously. Finally, a nitride layer is capped on the twin-well regions.

The present invention provides a method of fabricating a twin-well CMOS device to implant the dopants directly through the nitride layer. It can reduce the number of processing steps so as to decrease the production cost.

SUMMARY OF THE INVENTION

The primary object of the present invention is to provide a method of manufacturing a twin-well CMOS integrated circuit device.

Another object of the present invention is to provide a twin-well CMOS IC device fabrication method which reduces the number of processing steps.

A further object of the present invention is to provide a twin-well CMOS IC device fabrication method which can lower the manufacture cost.

In accordance with these objects of the present invention, a new method of fabricating the twin-well CMOS integrated circuit device is achieved.

The pad oxide layer and nitride layer are formed on a P-type semiconductor silicon wafer. Then, the alignment mark photoresist pattern is formed by the conventional lithography technique. The alignment mark region is in clear field, while other regions are in dark field. Next, using the alignment mark photoresist pattern as a mask, the nitride layer is patterned by plasma-etching technique to form the nitride alignment mark. After removing the alignment mark photoresist pattern, the N-well region is formed by lithography and ion-implantation techniques. Thereafter, the P-well region is formed by lithography and ion-implantation methods again.

Next, the active device region photoresist is formed by lithography technique. Using the photoresist pattern as a mask, the nitride layer is partially etched to open the windows by plasma-etching technique. The second P-well region photoresist is then formed, followed by the P-field deep-implantation process. The field oxide regions for isolation are also grown in the window openings during the P-field drive-in step. Finally, the remaining of nitride layer is removed.

BRIEF DESCRIPTION OF THE DRAWINGS

In the accompanying drawings forming a material part of this specification, there is shown.

FIG. 1 is the cross sectional view of a silicon substrate after the pad oxide layer and the nitride layer are formed.

FIG. 2 is the cross sectional view of a silicon substrate of FIG. 1 after the alignment mark photoresist pattern is formed.

FIG. 3 is the cross sectional view of a silicon substrate of FIG. 2 after the nitride alignment mark pattern is formed.

FIG. 4 is the cross sectional view of a silicon substrate of FIG. 3 after N-type impurities are implanted into the silicon substrate to form the N-doped region.

FIG. 5 is the cross sectional view of a silicon substrate of FIG. 4 after P-type impurities are implanted into the silicon substrate to form the P-doped region.

FIG. 6 is the cross sectional view of a silicon substrate of FIG. 5 after high-temperature well drive-in process.

FIG. 7 is the cross sectional view of a silicon substrate of FIG. 6 after the open windows in the active region are formed.

FIG. 8 is the cross sectional view of a silicon substrate of FIG. 7 after the P-well region performs deep-implantation.

FIG. 9 is the cross sectional view of a silicon substrate of FIG. 8 after the high-temperature P-field drive-in to form the field oxide regions.

FIG. 10 is the cross sectional view of a silicon substrate of FIG. 9 after the remaining of nitride layer is removed.

DESCRIPTION OF THE PREFERRED EMBODIMENT

The invention discloses herein is directed to a method of manufacturing a twin-well CMOS device. In the following description, numerous details are set forth in order to provide a thorough understanding of the present invention. It will be obvious, however, to one skilled in the art of integrated circuit that variations of these specific details may be employed to practice the present invention. In other instance, well-known processing steps are not described in detail in order not unnecessarily to obscure the present invention.

Figure 1:
FIG. 1 through 10 schematically illustrate in cross sectional representation one preferred embodiment of the present invention.

Referring now more particularly to FIG. 1, continuously forming the pad oxide layer 3 and the nitride layer 5 on a P-type semiconductor silicon substrate 1. The pad oxide layer 3 which is formed under 1000° C. thermal oxidation environment has a thickness of about 320 to 380 Angstroms. The nitride layer 5 which has a thickness of about 1350 to 1650 Angstroms is formed by low pressure chemical vapor deposition (LPCVD) technique under the following conditions: it has a base pressure of 350 mTorr, the temperature is about 760° C., with reactant gases $SiH_2Cl_2$ and $NH_3$ flowing.

Figure 2:
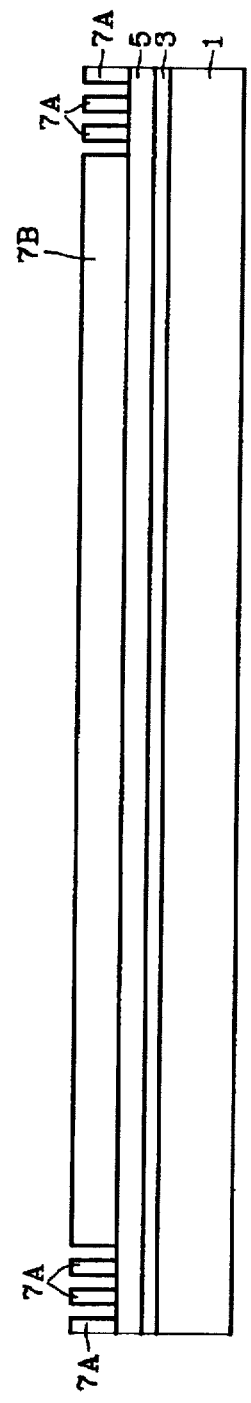

Referring now to FIG. 2, the alignment mark photoresist pattern 7A is formed by the conventional lithography technique. The alignment mark region 7A is in clear field, while other regions are in dark field 7B.

Figure 3:
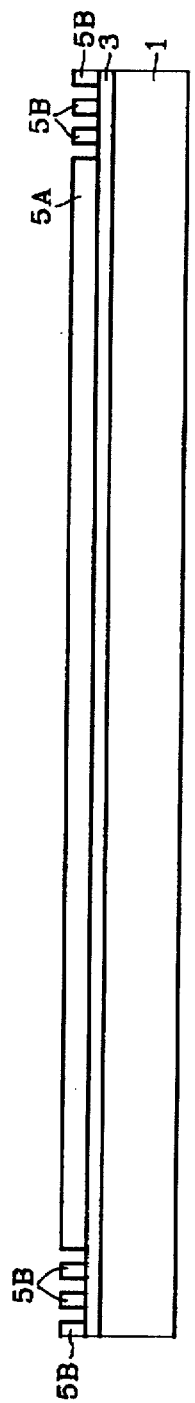

Referring now to FIG. 3, using the alignment mark photoresist pattern 7A and dark field photoresist 7B as an etching mask, the nitride layer 5 is partially etched by plasma-etching technique to form the nitride alignment mark 5B and the nitride layer pattern 5A. The plasma-etching process can utilize either magnetic enhanced reactive ion etching (MERIE), electron cyclotron etching (ECR) or the conventional reactive ion etching (RIE) method. In current sub-microm VLSI technology, it usually uses the MERIE method with reactant gases of $CF_4$, $CHF_3$, Ar and $O_2$. Thereafter, the alignment mark photoresist pattern 7A and dark field photoresist 7B are stripped by oxygen plasma and sulfuric acid ($H_2SO_4$).

Figure 4:
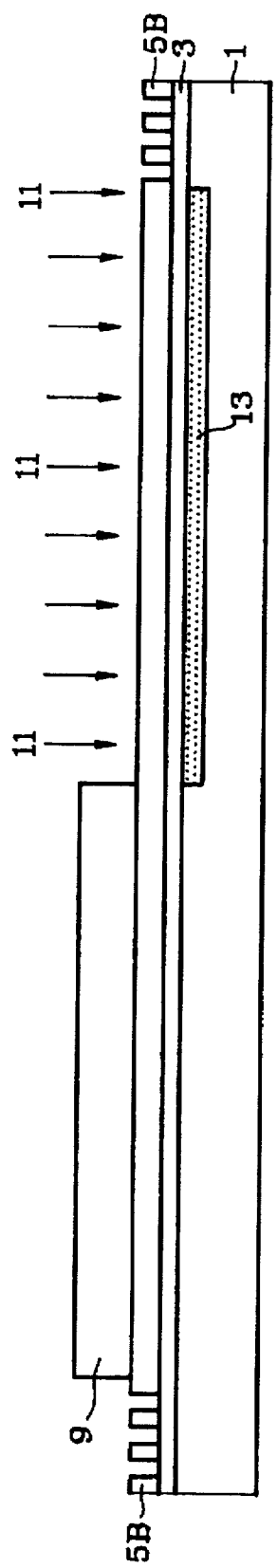

Referring now to FIG. 4, the N-well photoresist pattern 9 is formed by the conventional lithography technique. By using the N-well photoresist pattern 9 as a mask, N-type dopants 11 are ion-implanted through the nitride layer pattern 5A and the pad oxide layer 3 into the P-type semiconductor silicon substrate 1 to form an N-doped region 13. The N-type impurities which are implanted into the silicon substrate are preferred to use Phosphorus ($P^{31}$) ions, with an implantation energy 60 to 180 keV, and an implantation dose of $10^{11}$ to $10^{13}$ cm$^{-2}$. Thereafter, the N-well photoresist pattern 9 is removed.

Figure 5:
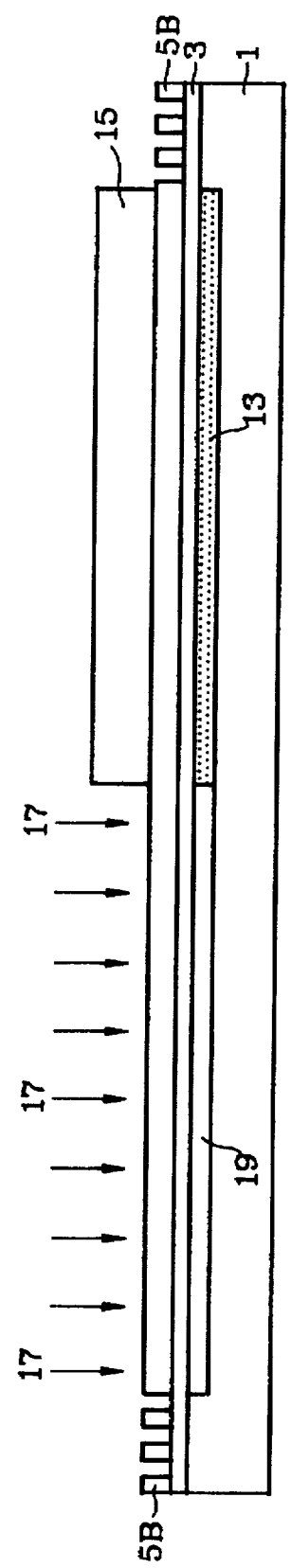

Referring now to FIG. 5, the P-well photoresist pattern 15 is formed by the conventional lithography technique again. By using P-well photoresist pattern 15 as a mask this time, P-type dopants are implanted through the nitride layer pattern 5A and the pad oxide layer 3 into the P-type semiconductor silicon substrate 1 to form a P-doped region 17. The P-type impurities which are implanted into the silicon substrate are preferred to use Boron ($B^{11}$) or borondifluoride ($BF_2$) ions, with an implantation energy of 30 to 100 keV, and an implantation dose of $10^{12}$ to $10^{13}$ cm$^{-2}$. Thereafter, the P-well photoresist pattern 15 is removed.

Figure 6:
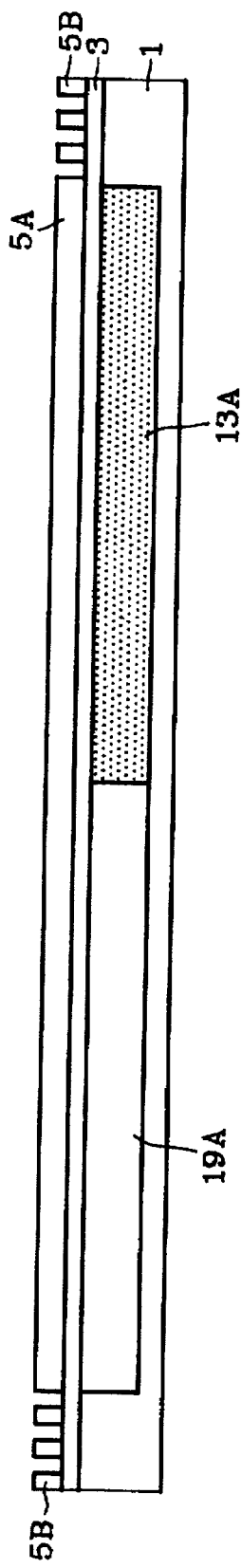

Referring now to FIG. 6, first thermally driven-in in nitrogen and oxygen environment at temperature about 1100° C. to 1200° C. is carried out for the purpose of activating of impurities and obtaining the desired depths, to thereby form an N-well region 13A and a P-well region 19A and thus a twin-well.

Figure 7:
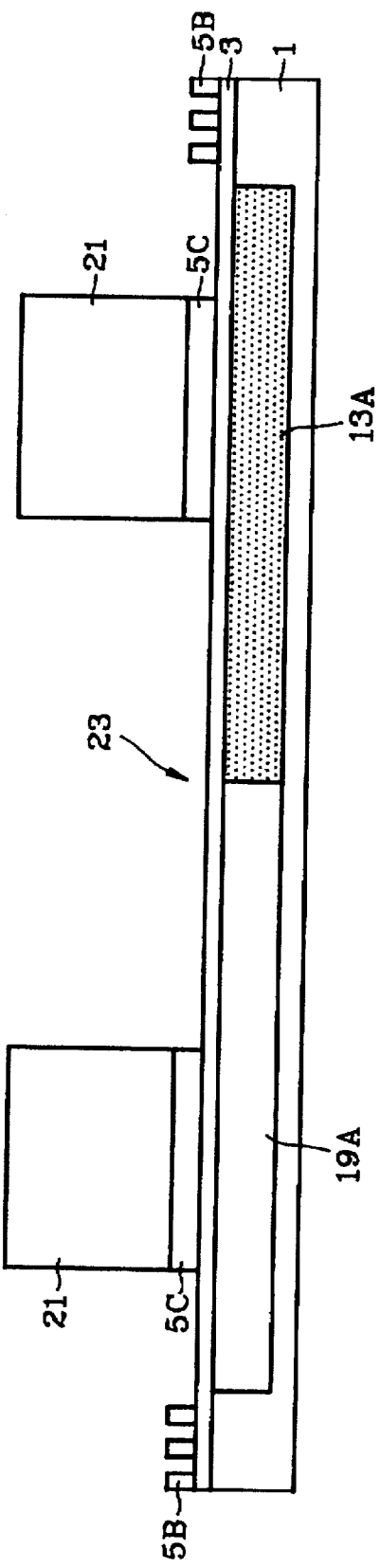

Referring now to FIG. 7, the active region photoresist pattern 21 is formed by the conventional lithography technique. By using the active region photoresist pattern 21 as a mask, the nitride layer 5A is partially etched by plasma-etching to form the nitride layer pattern 5C and the opening window 23 between the N-well and P-well regions. The plasma-etching technique for nitride layer can still use MERIE, ECR or RIE methods which are described before with reactant gases of $CF_4$, $CHF_3$, Ar and $O_2$.

Figure 8:
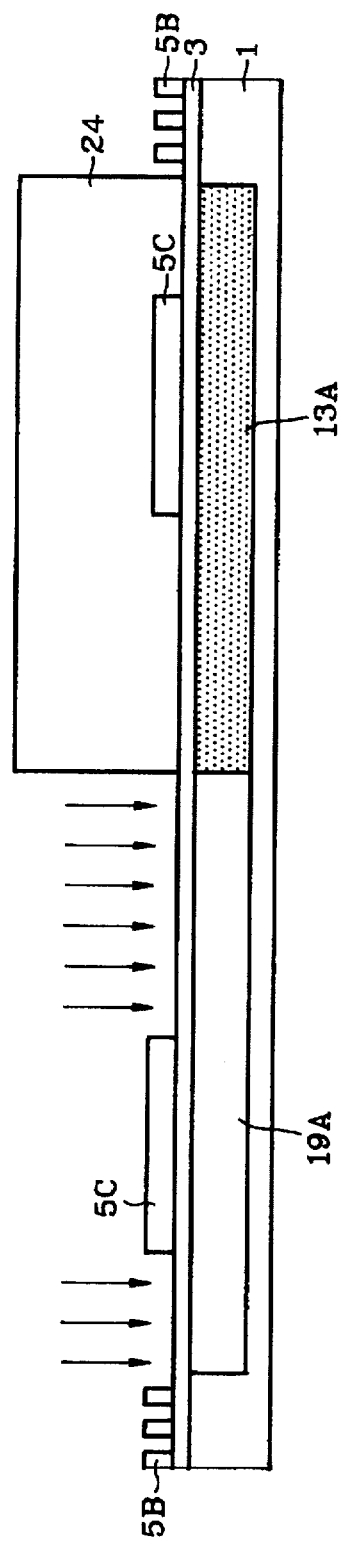

Referring now to FIG. 8, the second P-well photoresist pattern 24 which is covering the N-well region is formed by the conventional lithography technique. Then, the P-type ions which are deep-implanted the P-well region are preferred to use Boron ($B^{11}$) or borondifluoride ($BF_2$) ions, with an implantation energy about 160 keV, and an implantation dose about $3 \times 10^{11}$ cm$^{-2}$. Thereafter, the second P-well photoresist pattern 24 is removed.

Figure 9:
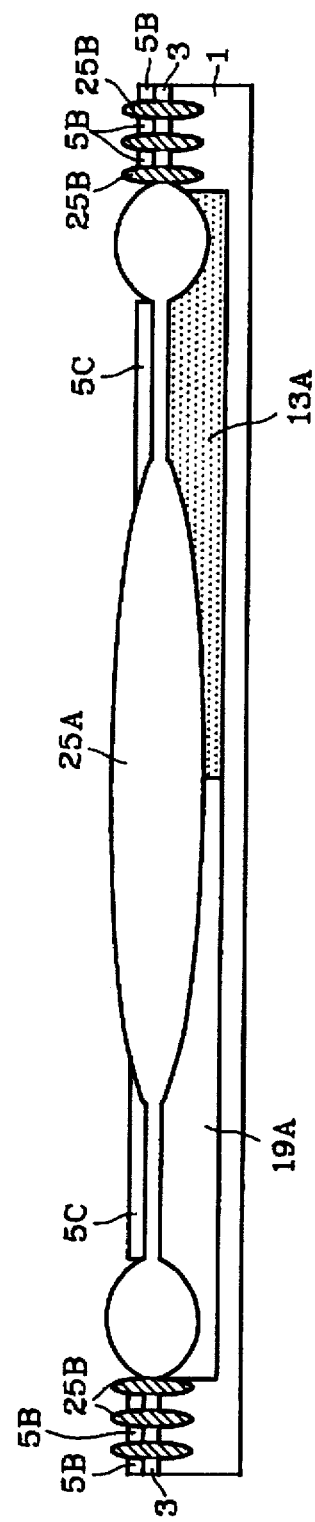

Referring now to FIG. 9, using the remaining of the nitride layer pattern 5C as an oxidation mask, the second drive-in is performed to activate the deep-implanted P-type dopants in the temperature range of 950° C. to 1050° C. for 200 to 300 minutes, and a field oxide region 25A is grown in the opening window 23 for isolation spontaneously. The thickness of the field oxide is about 1000 to 2000 Angstroms.

Figure 10:
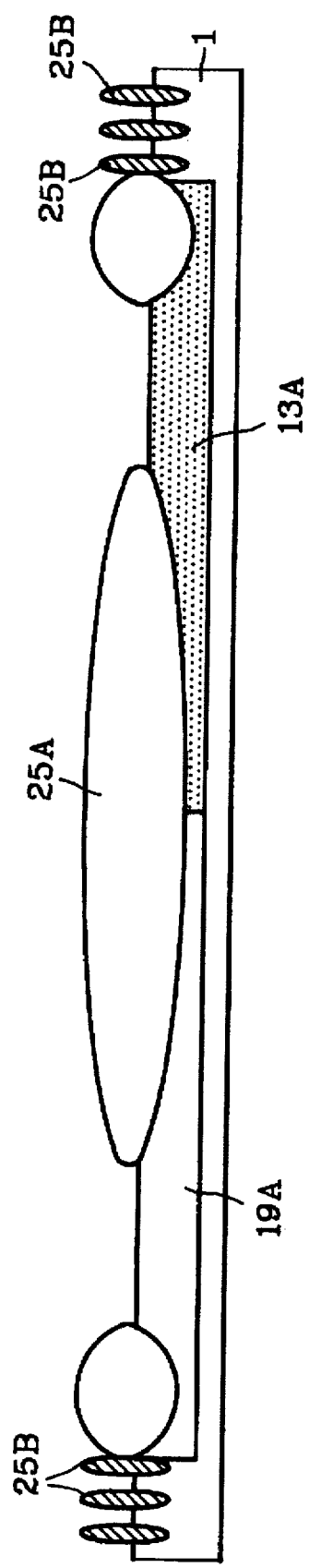

Referring now to FIG. 10, the remaining of the nitride layer 5C and the pad oxide layer 3 are stripped by hot phosphoric acid. The final twin-well structure of the preferred embodiment according to the present invention is then completed. Therefore, the N-well and P-well regions are formed by directly ion-implanted the dopants through the nitride layer that can reduce the number of processing steps so as to increase the production throughput.

While the present invention has been particularly shown and described with reference to a preferred embodiment, it will be understood by those skilled in the art that various changes in form and detail may be without departing from the spirit and scope of the present invention.

What I claimed is:

1. A method of fabricating a twin-well integrated circuit device, said method comprising the steps of:
   (a) forming a pad oxide layer on a P-type semiconductor silicon substrate;
   (b) forming a nitride layer overlaying said pad oxide layer;
   (c) forming an alignment mark photoresist pattern overlaying said nitride layer by lithography wherein said alignment mark photoresist pattern is in a clear field, while other regions are in a dark field;
   (d) partially etching said nitride layer to form a nitride alignment mark pattern by using alignment mark photoresist pattern as a mask;
   (e) stripping said alignment photoresist pattern;
   (f) forming a N-well photoresist pattern by lithography;
   (g) ion-implanting N-type dopants through said pad oxide layer and said nitride layer into said P-type semiconductor substrate to form an N-doped region;
   (h) removing said N-well photoresist pattern;
   (i) forming a P-well photoresist pattern by lithography;
   (j) ion-implanting P-type dopants through said pad oxide layer and said nitride layer into said P-type semiconductor silicon substrate to form a P-doped region;
   (k) removing said P-well photoresist pattern;
   (l) first thermally driving in for activating said dopants inside said N-doped and P-doped regions to form N-well and P-well regions;
   (m) forming an active region photoresist pattern by lithography;
   (n) partially etching said nitride layer to form an opening window, wherein said opening window is between said N-well and P-well regions;
   (o) forming the second P-well photoresist pattern by lithography;
   (p) deep ion-implanting P-type dopants into said P-well regions;
   (q) removing said second P-well photoresist pattern;
   (r) second thermally driving in for activating said deep implanted P-type dopants inside said P-well regions, and forming a field oxide region therein said opening window for isolation spontaneously; and
   (s) removing a remaining part of said pad oxide layer and said nitride layer.

2. The method of claim 1, wherein said first pad oxide layer which is formed in a temperature of 800° to 1000° C. high-temperature oxygen environment, has a thickness of about between 320 to 380 Angstroms.

3. The method of claim 1, wherein said first nitride layer which is formed by low pressure chemical vapor deposition (LPCVD) has a thickness of about between 1350 to 1650 Angstroms.

4. The method of claim 1, wherein said N-doped region which is formed by ion implantation, is doped with Phosphorus ($P^{31}$) ions, with an implantation energy of 50 to 150 keV, and an implantation dose of $10^{11}$ to $10^{13}$ cm$^{-2}$.

5. The method of claim 1, wherein said P-doped region which is formed by ion implantation, is doped with boron ($B^{11}$) or borondifluoride ($BF_2$) ions, with an implantation energy of 10 to 80 keV, and an implantation dose of $10^{12}$ to $10^{13}$ cm$^{-2}$.

6. The method of claim 1, wherein said first thermally drive in is performed in the temperature range of 1100° C. to 1200° C.

7. The method of claim 1, wherein said second thermally drive in is performed in the temperature range of 950° C. to 1050° C. for 200 to 300 minutes.

8. The method of claim 1, wherein said field oxide region has a thickness of about between 1000 to 2000 Angstroms.

9. The method of claim 1, wherein said a P-type semiconductor substrate is an N-type semiconductor substrate.

* * * * *